United States Patent
Kinoshita et al.

(10) Patent No.: US 9,680,288 B2
(45) Date of Patent: Jun. 13, 2017

(54) OPTICAL AMPLIFICATION DEVICE

(71) Applicant: FUJITSU LIMITED, Kawasaki-shi, Kanagawa (JP)

(72) Inventors: Susumu Kinoshita, Fuchu (JP); Setsuo Yoshida, Inagi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/865,876

(22) Filed: Sep. 25, 2015

(65) Prior Publication Data
US 2016/0149378 A1  May 26, 2016

(30) Foreign Application Priority Data

Nov. 20, 2014 (JP) .................................. 2014-235230

(51) Int. Cl.
*H01S 5/068* (2006.01)
*H01S 5/062* (2006.01)
(Continued)

(52) U.S. Cl.
CPC ........ *H01S 5/06817* (2013.01); *H01S 5/0617* (2013.01); *H01S 5/0683* (2013.01);
(Continued)

(58) Field of Classification Search
CPC ............... H01S 5/06817; H01S 5/0683; H04B 10/2914; H04B 10/293; H04B 10/2931
See application file for complete search history.

(56) References Cited

U.S. PATENT DOCUMENTS 6,842,587 B1 * 1/2005 McGhan .............. H04B 10/503
398/183
7,081,988 B2 * 7/2006 Charlet .............. H04B 10/2941
359/337.11
(Continued)

FOREIGN PATENT DOCUMENTS

JP 2012-165127 8/2012
JP 2013-229836 11/2013
WO WO 2006/048944 5/2006

OTHER PUBLICATIONS

"Uncooled, Polarization-insensitive AlGaInAs MQW-SOA Module Operable up to 75° C. with Constant Current", ECOC Technical Digest, Tu.6.LeSaleve.2, pp. 1-3, Jul. 27, 2011.
(Continued)

*Primary Examiner* — Eric Bolda
(74) *Attorney, Agent, or Firm* — Staas & Halsey LLP

(57) ABSTRACT

An optical amplification device includes: a semiconductor optical amplifier; a first detector that detects an input optical power of the semiconductor optical amplifier; a second detector that detects an output optical power of the semiconductor optical amplifier; and a controller that controls a driving current of the semiconductor optical amplifier, wherein the controller supplies a predetermined driving current to the semiconductor optical amplifier when an optical signal is not input to the semiconductor optical amplifier, the second detector detects an optical power of Amplified Spontaneous Emission (ASE) output from the semiconductor optical amplifier when the predetermined driving current is supplied to the semiconductor optical amplifier, and the controller controls the driving current of the semiconductor optical amplifier based on the input optical power of the semiconductor optical amplifier detected by the first detector, and the optical power of the ASE.

5 Claims, 13 Drawing Sheets

(51) Int. Cl.
    *H01S 5/0683*     (2006.01)
    *H01S 5/06*     (2006.01)
    *H04B 10/29*     (2013.01)
    *H01S 5/024*     (2006.01)
    *H01S 5/50*     (2006.01)

(52) U.S. Cl.
    CPC ...... *H01S 5/06223* (2013.01); *H01S 5/02407* (2013.01); *H01S 5/50* (2013.01); *H01S 2301/06* (2013.01)

(56) References Cited

U.S. PATENT DOCUMENTS

| | | | |
|---|---|---|---|
| 2004/0264888 A1* | 12/2004 | Go | G02B 6/325 |
| | | | 385/92 |
| 2005/0105170 A1* | 5/2005 | Shukunami | H01S 3/06754 |
| | | | 359/341.41 |
| 2008/0107428 A1 | 5/2008 | Abe et al. | |
| 2010/0321768 A1* | 12/2010 | Sone | H01S 5/50 |
| | | | 359/337 |
| 2011/0116161 A1* | 5/2011 | Yoshida | H01S 5/50 |
| | | | 359/344 |
| 2011/0243576 A1 | 10/2011 | Oomori | |
| 2013/0287402 A1 | 10/2013 | Oomori | |

OTHER PUBLICATIONS

"Compact, low-power-consumption AlGaInAs MQW-SOA Modules", General Conference of IEICE, C-4-25, p. 276, Mar. 20-23, 2012, Okayama.

\* cited by examiner

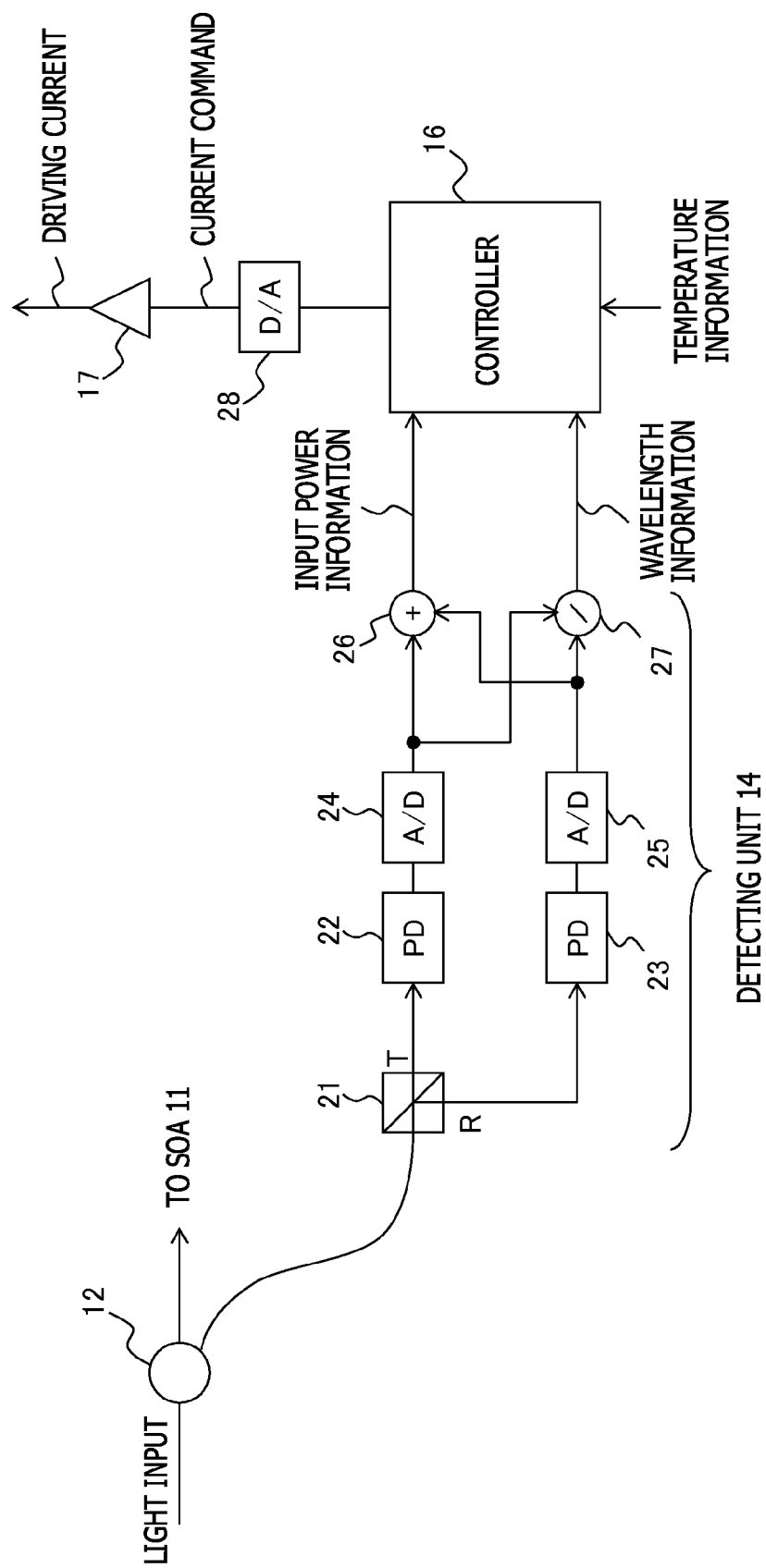

FIG. 6

| ADDRESS | | | DATA |
|---|---|---|---|
| INPUT OPTICAL POWER | WAVELENGTH | TEMPERATURE | DRIVING CURRENT |
| 00 | 00 | 00 | xxx1 |
| 00 | 00 | 01 | xxx2 |
| 00 | 00 | 10 | xxx3 |
| 00 | 00 | 11 | xxx4 |
| 00 | 01 | 00 | xxx5 |
| ⋮ | ⋮ | ⋮ | ⋮ |
| 11 | 11 | 10 | yyy8 |
| 11 | 11 | 11 | yyy9 |

OPTICAL AMPLIFICATION DEVICE

CROSS-REFERENCE TO RELATED APPLICATIONS

This application is based upon and claims the benefit of priority of the prior Japanese Patent Application No. 2014-235230 filed on Nov. 20, 2014, the entire contents of which are incorporated herein by reference.

FIELD

The embodiments discussed herein are related to an optical amplification device including a semiconductor optical amplifier.

BACKGROUND

An optical amplification device including a Semiconductor Optical Amplifier (SOA) has been put to practical use. An optical gain of the SOA is controlled by a driving current. That is, the SOA amplifies an input optical signal by an optical gain according to the driving current. Accordingly, in order to generate an optical signal with a desired optical level (e.g., a desired optical power), the optical amplification device detects the power of an input optical signal and applies the driving current according to the detected optical power to an SOA element.

However, the optical gain of the SOA depends on the temperature of the SOA element. Accordingly, the optical amplification device including the SOA has a function of controlling, for example, the surrounding temperature of the SOA element to be a constant temperature. In this case, the surrounding temperature of the SOA element is controlled using, for example a Peltier device.

When the surrounding temperature of the SOA is controlled to be a constant temperature using the Peltier device, a driving signal to be applied to the Peltier device is generated by, for example, a pulse width modulation (PWM) method. In a configuration where a driving signal is generated by the PWM method, power consumption for driving the Peltier device is suppressed. However, the PWM control is achieved by turning ON/OFF a switching device at a high speed. Also, in order to reduce the size of the optical amplification device, a PWM control circuit is mounted in the vicinity of the SOA element. Accordingly, when the driving signal of the Peltier device is generated by the PWM method, a switching noise is added to the optical signal amplified by the SOA.

The following are reference documents.
[Document 1] International Publication Pamphlet No. WO2006/048944
[Document 2] Japanese Laid-Open Patent Publication No. 2012-165127
[Document 3] Japanese Laid-Open Patent Publication No. 2013-229836
[Document 4] Shinsuke Tanaka et al., "*Uncooled, Polarization-insensitive AlGaInAs MQW-SOA Module Operable up to 75° C. with Constant Current*", ECOC Technical Digest Tu. 6. LeSaleve2, 2011
[Document 5] Shinsuke Tanaka et al., "*Compact, low-power-consumption AlGaInAs MQW-SOA modules*", General Conference of the Institute of Electronics, Information and Communication Engineers, C-4-25, 2012

SUMMARY

According to an aspect of the invention, an optical amplification device includes: a semiconductor optical amplifier; a first detector that detects an input optical power of the semiconductor optical amplifier; a second detector that detects an output optical power of the semiconductor optical amplifier; and a controller that controls a driving current of the semiconductor optical amplifier, wherein the controller supplies a predetermined driving current to the semiconductor optical amplifier when an optical signal is not input to the semiconductor optical amplifier, the second detector detects an optical power of Amplified Spontaneous Emission (ASE) output from the semiconductor optical amplifier when the predetermined driving current is supplied to the semiconductor optical amplifier, and the controller controls the driving current of the semiconductor optical amplifier based on the input optical power of the semiconductor optical amplifier detected by the first detector, and the optical power of the ASE.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a view illustrating an exemplary configuration of a detecting unit and a controller of the first exemplary embodiment;

FIG. 6 is a view illustrating an example of a memory that stores control information;

DESCRIPTION OF EMBODIMENTS

Figure 1:
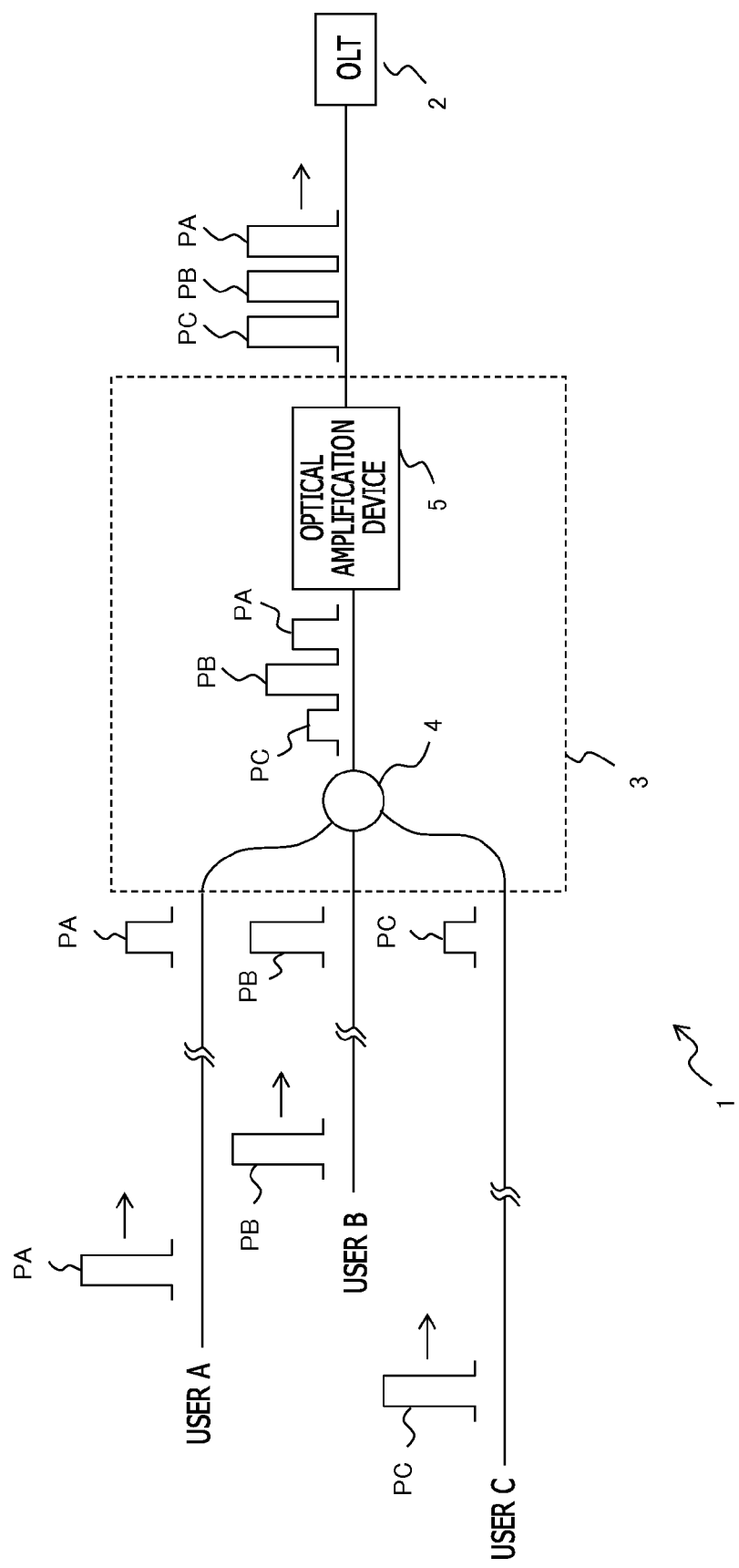
FIG. 1 is a view illustrating an example of a network employing an optical amplification device.

FIG. 1 illustrates an example of a network employing an optical amplification device according to an exemplary embodiment of the present disclosure. In the example illustrated in FIG. 1, the optical amplification device is used in a passive optical network (PON) system.

The PON system 1 includes an optical line terminal (OLT) station 2 and a relay station 3. The OLT station 2 transmits data to each user through an optical fiber line. The OLT station 2 receives data from each user through the optical fiber line. The relay station 3 splits an optical signal transmitted from the OLT station 2 and distributes the signals to a plurality of users. That is, the relay station 3 operates as an optical splitter. Also, the relay station 3 may multiplex optical signals transmitted from the plurality of users and guide the optical signals to the OLT station 2.

The relay station 3 includes an optical coupler 4 and an optical amplifier 5. The optical coupler 4 multiplexes the optical signals transmitted from the plurality of users. Also, the optical amplifier 5 amplifies the optical signals multiplexed by the optical coupler 4.

In the PON system 1 configured as described above, it is assumed that transmission power levels of optical signals transmitted from respective users are the same. That is, an optical packet signal PA transmitted from a user A, an optical packet signal PB transmitted from a user B, and an optical packet signal PC transmitted from a user C have the same transmission power levels. However, transmission distances from the relay station 3 to respective users are not the same. In this case, power levels of optical packet signals reaching the relay station 3 are different according to the users. In the example illustrated in FIG. 1, a transmission distance between the relay station 3 and the user B is shortest, and a transmission distance between the relay station 3 and the user C is longest. In this case, in the relay station 3, a reception power of the optical packet signal PB is largest, and a reception power of the optical packet signal PC is smallest.

Here, for example, it is assumed that the optical amplifier of the relay station 3 amplifies a received optical signal by a constant optical gain. In this case, a power level of an optical packet signal reaching the OLT station 2 is also varied according to each user. Then, in the OLT station 2, a reception quality is varied according to each user.

Therefore, the optical amplification device 5 monitors an input optical power of an optical signal received from each user, and controls an optical gain according to the input optical power. Here, the optical amplification device 5 adjusts the optical gain by controlling a driving current. As a result, in the example illustrated in FIG. 1, the power levels of the optical packet signals PA to PC output from the relay station 3 become substantially uniform.

The optical packet signal is also referred to as an optical burst signal. Also, the PON system illustrated in FIG. 1 is only one exemplary embodiment, but the optical amplification device 5 may be used in a network having another configuration.

First Exemplary Embodiment

Figure 2:
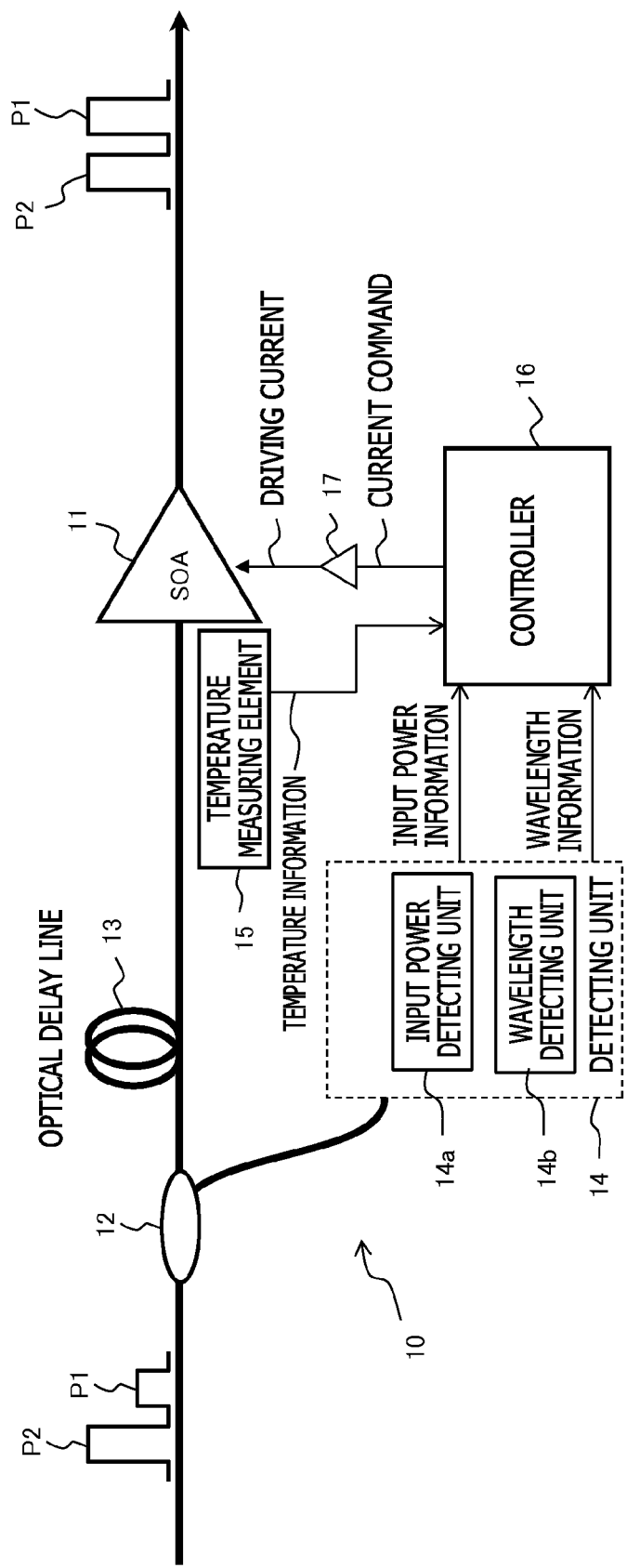
FIG. 2 is a view illustrating an example of an optical amplification device of a first exemplary embodiment.

FIG. 2 illustrates an example of an optical amplification device of a first exemplary embodiment of the present disclosure. An optical amplification device 10 of the first exemplary embodiment includes a semiconductor optical amplifier (SOA) 11, an optical coupler 12, an optical delay line 13, a detecting unit 14, a temperature measuring element 15, a controller 16, and a driver 17. Also, the optical amplification device 10 corresponds to, for example, the optical amplification device 5 used in the PON system 1 illustrated in FIG. 1.

Figure 3:
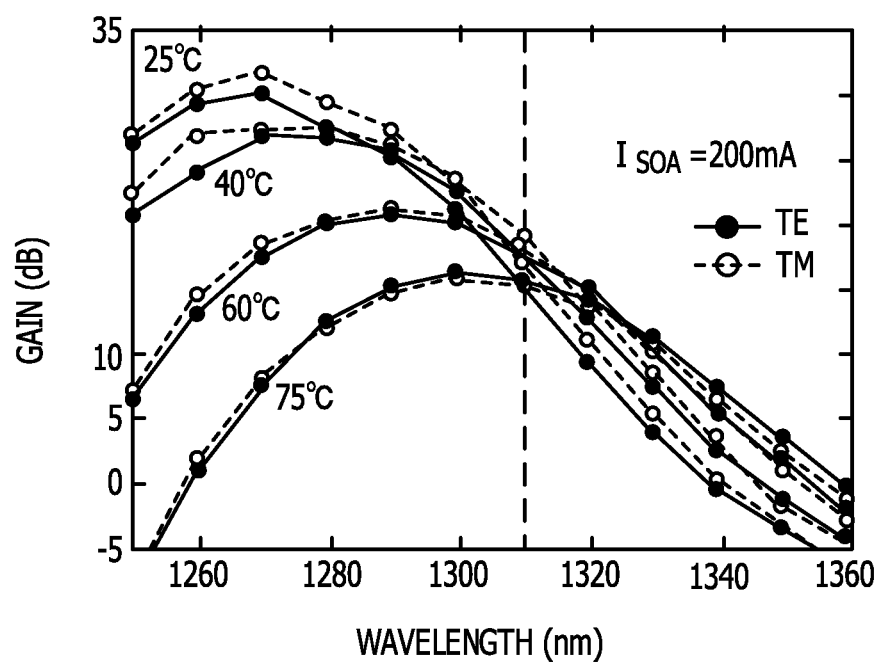
FIG. 3 is a view illustrating an exemplary characteristic of an SOA.

The SOA 11 amplifies an input optical signal by a gain corresponding to an applied driving current. Meanwhile, the gain of the SOA 11 depends on a temperature and a wavelength as well as the driving current. An exemplary characteristic of the SOA is illustrated in FIG. 3. The horizontal axis indicates a wavelength of an input light. The vertical axis indicates a gain of the SOA. The driving current is 200 mA.

The optical coupler 12 splits the input optical signal and guides the split signals to the SOA 11 and the detecting unit 14. That is, the optical coupler 12 operates as an optical splitter. The optical delay line 13 is provided between the optical coupler 12 and the SOA 11 to delay the input optical signal. The length of the optical delay line 13 is determined based on a time required for processings in the detecting unit 14 and the controller 16. For example, the length of the optical delay line 13 is determined such that the time delayed by the optical delay line 13 becomes longer than the time required for determining the driving current by the detecting unit 14 and the controller 16.

The detecting unit 14 includes an input power detecting unit 14a and a wavelength detecting unit 14b. The input power detecting unit 14a includes a light receiving element (e.g., a photodiode), and detects a power of a light input to the SOA 11. The wavelength detecting unit 14b detects a wavelength of the light input to the SOA 11. Then, the detecting unit 14 generates input power information indicating the power of the light input to the SOA 11, and wavelength information indicating the wavelength of the light input to the SOA 11.

The temperature measuring element 15 is disposed in the vicinity of the SOA 11 to measure the temperature of the SOA 11. The temperature measuring element 15 is implemented by, for example, a thermistor or a platinum temperature-measuring element without any particular limitation. The output signal of the temperature measuring element 15 is provided to the controller 16 as temperature information indicating the temperature of the SOA 11.

The controller 16 controls the driving current of the SOA 11 based on the input power information, the wavelength information, and the temperature information. Here, the controller 16 determines the driving current to be supplied to the SOA 11 such that a power of an optical packet signal output from the SOA 11 becomes a desired output optical power. Then, the controller 16 outputs a current command signal indicating a determined driving current. The driver 17 supplies the driving current to the SOA 11 according to the current command signal generated by the controller 16.

In the optical amplification device 10 configured as described above, it is assumed that optical packet signals P1 and P2 are sequentially input. In this case, the controller 16 determines the driving current in order to adjust the output power of the optical packet signal P1 to a target level based on input power information indicating an input optical power of the optical packet signal P1, wavelength information indicating the wavelength of the optical packet signal P1, and temperature information indicating the temperature of the SOA 11. Then, the controller 16 generates a current command signal indicating the determined driving current, and the driver 17 supplies the driving current to the SOA 11 according to the current command signal. As a result, the optical power of the optical packet signal P1 is controlled to the target level.

Likewise, the controller 16 determines the driving current in order to adjust the output power of the optical packet signal P2 to a target level based on input power information indicating an input optical power of the optical packet signal P2, wavelength information indicating the wavelength of the optical packet signal P2, and temperature information indicating the temperature of the SOA 11. Then, the controller 16 generates a current command signal indicating the determined driving current, and the driver 17 supplies the driving current to the SOA 11 according to the current command signal. As a result, the optical power of the optical packet signal P2 is controlled to the target level.

FIG. 4 illustrates an exemplary configuration of the detecting unit 14 and the controller 16 of the first exemplary embodiment. In the present exemplary embodiment, the detecting unit 14 includes a split filter 21, photodetectors PD 22 and 23, A/D converters 24 and 25, an adder 26, and a divider 27. Also, the light input to the SOA 11 is split by the optical coupler 12 to be guided to the split filter 21.

The split filter 21 splits the input light and outputs the split light through a transmission port T and a reflection port R. The transmitted light output through the transmission port T is guided to the photodetector 22. Meanwhile, the reflected light output through the reflection port R is guided to the photodetector 23.

Figure 5A:
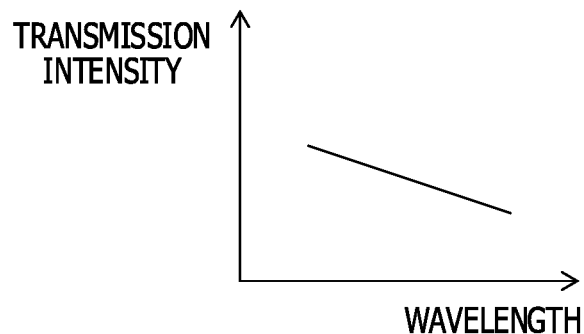
FIGS. 5A to 5D are views illustrating the characteristics of a split filter.
Figure 5B:
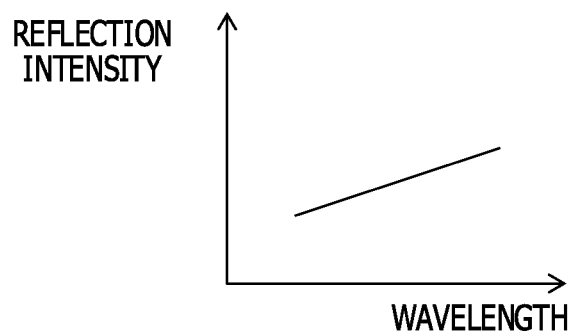

FIGS. 5A to 5D illustrate characteristics of the split filter 21. The transmittance and reflectance of the split filter 21 depend on the wavelength of the input light. In the present exemplary embodiment, the intensity of the transmitted light output through the transmission port T monotonically decreases with respect to the wavelength, as illustrated in FIG. 5A. The intensity of the reflected light output through the reflection port R monotonically increases with respect to the wavelength as illustrated in FIG. 5B.

The photodetector 22 converts the transmitted light output through the transmission port T of the split filter 21 into an electrical signal. The output signal of the photodetector 22 indicates the intensity of the transmitted light output through the transmission port T. Likewise, the photodetector 23 converts the reflected light output through the reflection port R of the split filter 21 into an electrical signal. The output signal of the photodetector 23 indicates the intensity of the reflected light output through the reflection port R. The A/D converter 24 converts the output signal of the photodetector 22 into a digital signal, and the A/D converter 25 converts the output signal of the photodetector 23 into a digital signal.

Figure 5C:
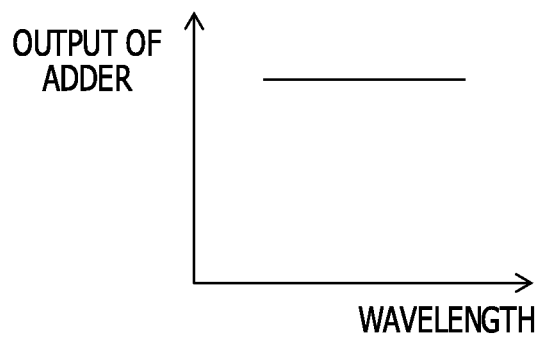

The adder 26 calculates a sum of the output signal of the A/D converter 24 and the output signal of the A/D converter 25. That is, the adder 26 calculates a sum of the intensity of the transmitted light and the intensity of the reflected light. Accordingly, the output signal of the adder 26 indicates a power of the input light. That is, input power information indicating the power of the input light is generated by the split filter 21, the photodetectors 22 and 23, the A/D converters 24 and 25, and the adder 26. Also, the output signal of the adder 26 is almost constant with respect to the wavelength as illustrated in FIG. 5C.

Figure 5D:
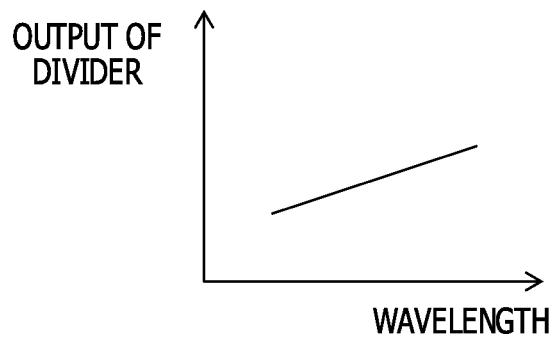

The divider 27 divides the output signal of the A/D converter 25 by the sum of the output signal of the A/D converter 24 and the output signal of the A/D converter 25. That is, the divider 27 divides the intensity of the reflected light by the sum of the intensity of the transmitted light and the intensity of the reflected light. Since the sum of the intensity of the transmitted light and the intensity of the reflected light is a power of the input light, the divider 27 actually divides the intensity of the reflected light by the power of the input light. Here, as illustrated in FIGS. 5A and 5B, the intensity of the transmitted light monotonically decreases with respect to the wavelength, and the intensity of the reflected light monotonically increases with respect to the wavelength. Accordingly, the value obtained by dividing the intensity of the reflected light by the power of the input light is dependent on the wavelength of the input light but not dependent on the power of the input light, as illustrated in FIG. 5D. That is, when the value obtained by dividing the intensity of the reflected light by the power of the input light is calculated, the wavelength of the input light may be estimated. Accordingly, the output signal of the divider 27 substantially indicates the wavelength of the input light. That is, the wavelength information indicating the wavelength of the input light is generated by the split filter 21, the photodetectors 22 and 23, the A/D converters 24 and 25, and the divider 27.

The input power information and wavelength information generated by the detecting unit 14 as described above are provided to the controller 16. Also, the temperature information indicating the temperature of the SOA 11 is provided to the controller 16 from the temperature measuring element 15 illustrated in FIG. 2.

The controller 16 includes a memory which stores control information indicating a combination of the input optical power of the SOA 11, the temperature of the SOA 11, the wavelength of the light input to the SOA 11, and the driving current of the SOA 11 in order to control the output optical power of the SOA 11 to a target level. Otherwise, the controller 16 may access such a memory.

FIG. 6 illustrates an example of a memory that stores control information. In this example, the control information is stored in a look-up table. The look-up table is created for each target output optical power. The target level of the output optical power is determined according to, for example, standards. Otherwise, the target level of the output optical power is specified by a user. Each look-up table, in this exemplary embodiment, stores data for a 6-bit address. The data indicate a driving current for obtaining the specified target output optical power.

The first to second bits of the address indicate an input optical power. For example, "00" to "11" indicate the following input optical power levels: 00: −8 to −6 [dBm], 01: −6 to −4 [dBm], 10: −4 to −2 [dBm], 11: −2 to 0 [dBm]

The third to fourth bits of the address indicate a wavelength of the input light. For example, "00" to "11" indicate the following wavelengths. 00: 1300 to 1305 [nm], 01: 1305 to 1310 [nm], 10: 1310 to 1315 [nm], 11: 1315 to 1320 [nm]

The fifth to sixth bits of the address indicate a temperature. For example, "00" to "11" indicate the following temperatures: 00: 0 to 20[° C.], 01: 20 to 40[° C.], 10: 40 to 60[° C.], 11: 60 to 80[° C.]

In this case, the controller 16 may be configured to include a circuit that compares input power information to a threshold value (e.g., −6 dBm, −4 dBm, −2 dBm) to convert the input power information into 2-bit address data. Also, the controller 16 may be configured to include a circuit that compares wavelength information to a threshold value (e.g., 1305 nm, 1310 nm, 1315 nm) to convert the wavelength information into 2-bit address data. Also, the controller 16 may be configured to include a circuit that compares temperature information to a threshold value (e.g., 20° C., 40° C., and 60° C.) to convert the temperature information into 2-bit address data.

The controller 16 determines a driving current with reference to the look-up table described above. Here, the controller 16 selects a look-up table corresponding to the target level of the output optical power specified by the user. As an example, it is assumed that the controller 16 receives input power information, wavelength information, and temperature information as described below: Input optical power: −1 dBm, wavelength of the input light: 1317 nm, temperature of the SOA 11: 45° C.

In this case, the controller 16 refers to the look-up table in the address "111110" to obtain "driving current=yyy8." Then, the controller 16 outputs a current command signal corresponding to "driving current=yyy8" and the driver 17 supplies the driving current according to the current command signal to the SOA 11. As a result, the power of the optical signal output from the SOA 11 is controlled to the target level.

The look-up table is created in advance by, for example, a measurement or a simulation. In the exemplary embodiment illustrated in FIG. 6, each of an input optical power, a wavelength, and a temperature is indicated by 2 bits, but may be indicated by 3 or more bits. Also, when the target level of the output optical power has been determined according to, for example, a standard, the optical amplification device 10 may be configured to include only one look-up table corresponding to the target level.

As described above, in the first exemplary embodiment, the optical amplification device 10 measures the temperature of the SOA 11, and controls the driving current of the SOA 11 using the measured result. Accordingly, the optical amplification device 10 does not need to have a function of controlling the temperature of the SOA 11 to be a constant temperature. As an example, the optical amplification device 10 does not need to be provided with a Peltier device for controlling the temperature of the SOA 11, and a PWM circuit for driving the Peltier device. Accordingly, according to the first exemplary embodiment, a switching noise caused by the constant temperature control does not occur, and thus a noise to be added to the optical signal is suppressed.

Second Exemplary Embodiment

Figure 7:
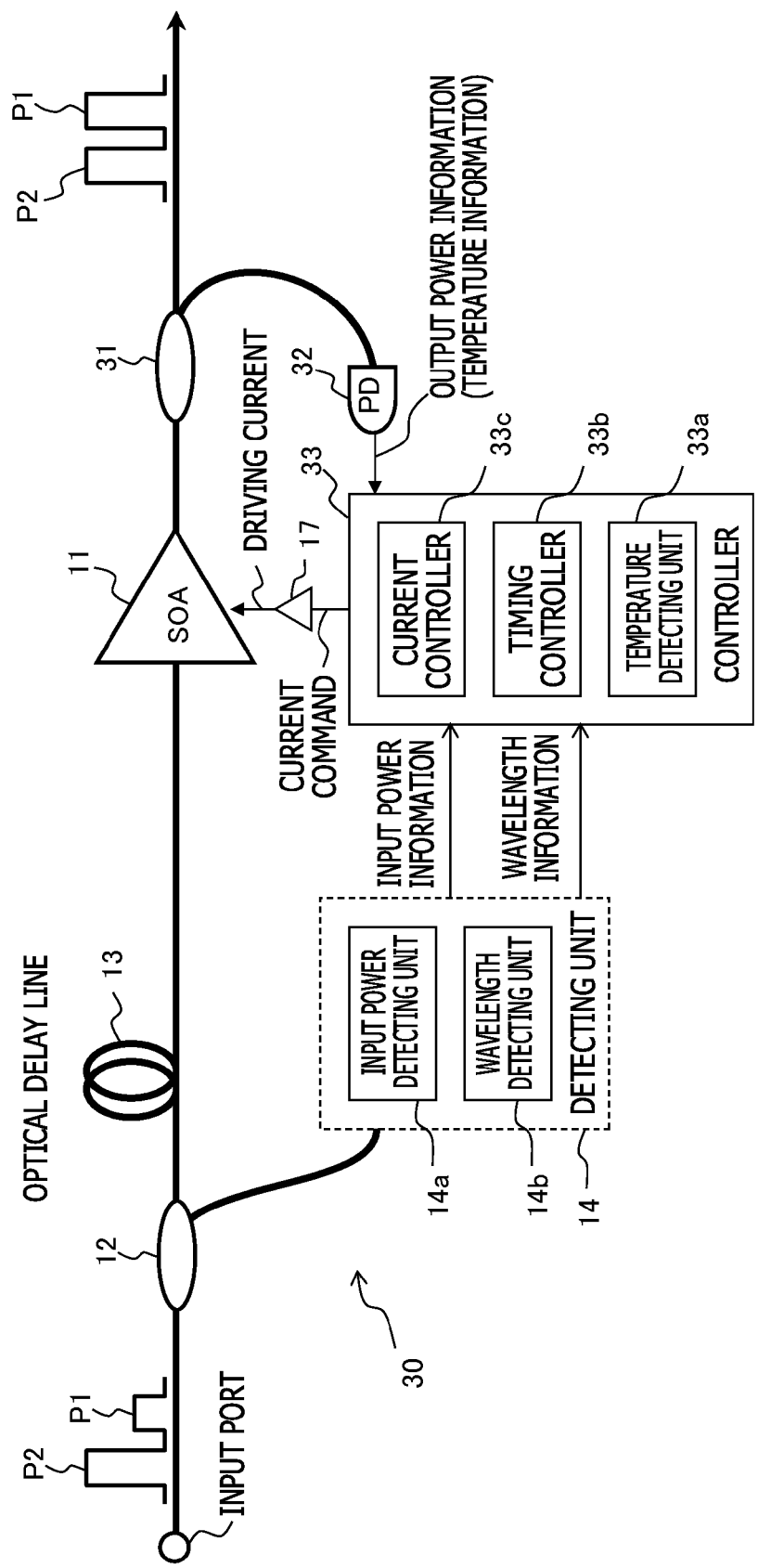
FIG. 7 is a view illustrating an example of an optical amplification device of a second exemplary embodiment.

FIG. 7 illustrates an example of an optical amplification device of a second exemplary embodiment of the present disclosure. An optical amplification device 30 of the second exemplary embodiment includes an SOA 11, an optical coupler 12, an optical delay line 13, a detecting unit 14, a driver 17, an optical coupler 31, a photodetector PD 32, and a controller 33. Also, as in the optical amplification device 10 of the first exemplary embodiment, the optical amplification device 30 also corresponds to, for example, the optical amplification device 5 used in the PON system 1 illustrated in FIG. 1. Also, the SOA 11, the optical coupler 12, the optical delay line 13, the detecting unit 14, and the driver 17 in the second exemplary embodiment are substantially the same as those in the first exemplary embodiment and descriptions thereof will be omitted.

The optical coupler 31 splits an output light of the SOA 11 and guides the split light to the photodetector 32. That is, the optical coupler 31 operates as an optical splitter. The photodetector 32 converts the output light of the SOA 11 guided from the optical coupler 31 into an electrical signal. An output signal of the photodetector 32 indicates the intensity of the output light of the SOA 11. The output signal of the photodetector 32 is provided to the controller 33 as output power information indicating a power of the output light of the SOA 11.

The controller 33 controls an optical gain of the SOA 11 based on the input power information, the wavelength information, and the output power information. Also, the input power information and the wavelength information are generated by the detecting unit 14 like those in the first exemplary embodiment.

The controller 33 includes a temperature detecting unit 33a, a timing controller 33b, and a current controller 33c. The temperature detecting unit 33a detects a temperature of the SOA 11 based on the output power information indicating the power of the output light of the SOA 11. The timing controller 33b controls a timing of supplying a driving current to the SOA 11. The current controller 33c controls a current to be supplied to the SOA 11.

Figure 8:
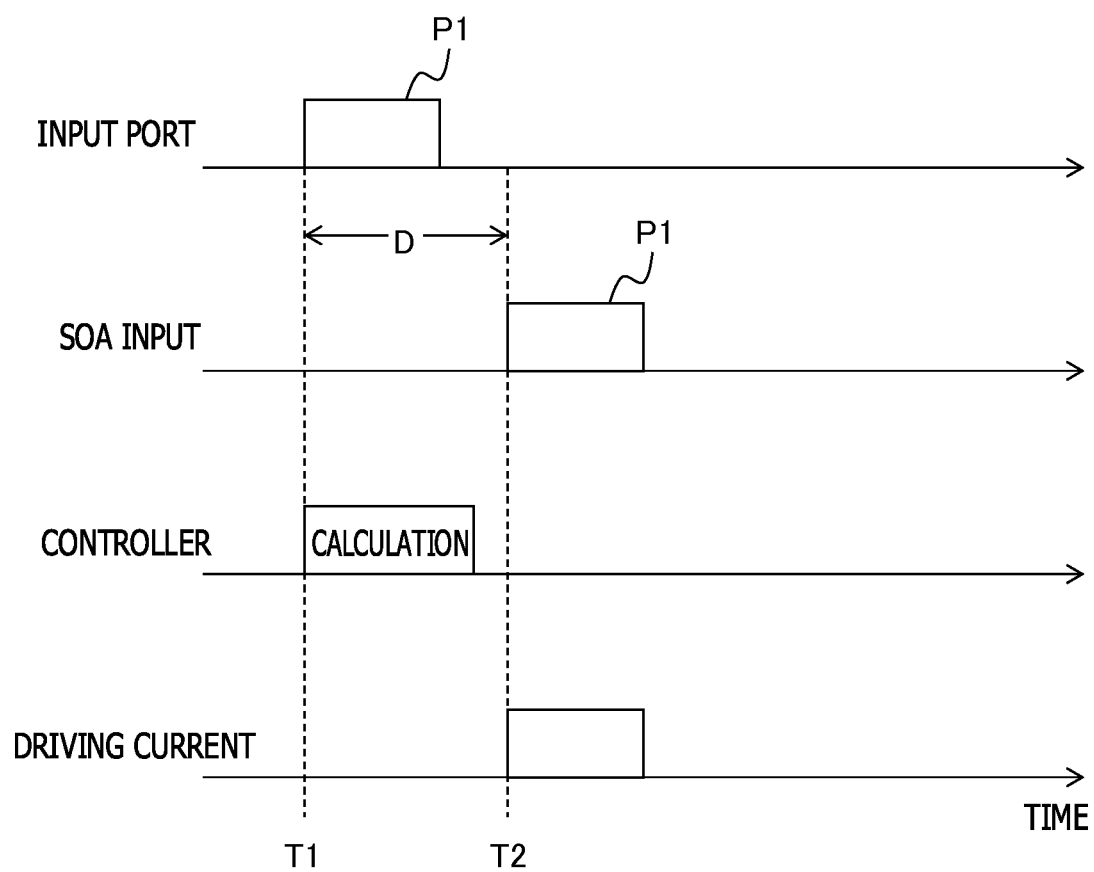
FIG. 8 is a timing chart illustrating an outline of an operation of the optical amplification device.

FIG. 8 is a timing chart illustrating an outline of an operation of the optical amplification device 30. Here, FIG. 8 illustrates the operation of the optical amplification device 30 when an optical packet signal P1 is input through an input port. However, in FIG. 8, an operation of detecting the temperature of the SOA 11 is omitted. Also, a delay time from the input port to the detecting unit 14 is sufficiently shorter than a delay time D caused by the optical delay line 13, and thus is negligible.

When the optical packet signal P1 is input to the optical amplification device 30, the detecting unit 14 and the controller 33 detect a rising edge of the input optical power. In the example illustrated in FIG. 8, a rising edge of the input optical power is detected at time T1. Then, the timing controller 33b determines a timing of initiating the supply of the driving current to the SOA 11 according to the detection of the rising edge of the input optical power. As an example, a time (in FIG. 8, time T2) after the lapse of a delay time D (a delay time caused by the optical delay line 13) from time T1 (when the rising edge of the input optical power was detected) is specified as a timing of initiating the supply of the driving current.

The current controller 33c starts a calculation of determining a driving current of the SOA 11 when the rising edge of the input optical power is detected. That is, the current controller 33c acquires input power information, wavelength information, and temperature information. The input power information and the wavelength information are generated by the detecting unit 14, as described above. The temperature information is generated by the temperature detecting unit 33a which will be described below. Also, it is assumed that a time required for determining the driving current of the SOA 11 by the current controller 33c is shorter than the delay time D caused by the optical delay line 13. That is, the length of the optical delay line 13 is designed such that the delay time D caused by the optical delay line 13 becomes longer than the time required for determining the driving current of the SOA 11 by the current controller 33c.

The current controller 33c determines the driving current based on the acquired input power information, the wavelength information, and the temperature information. Here, the current controller 33c refers to the look-up table illustrated in FIG. 6 by using the acquired input power information, the wavelength information, and the temperature information to acquire corresponding driving current data. Then, the current controller 33c outputs a current command signal indicating the driving current data at a timing specified by the timing controller 33b (time T2 in FIG. 8). Then, the driver 17 generates the driving current according to the current command signal. As a result, the SOA 11 amplifies the optical packet signal P1 by the optical gain corresponding to the driving current determined by the current controller 33c.

The detecting unit 14 and the controller 33 detect a falling edge of the input optical power. Then, the controller 33 stops the driving current after elapse of the delay time D from the timing when the falling edge of the input optical power was detected.

In this manner, the controller 33 determines a driving current based on the input power information, the wavelength information, and the temperature information in a period of time the optical packet signal is propagated through the optical delay line 13. Then, the controller 33 supplies the determined driving current to the SOA 11.

Hereinafter, descriptions will be made on a method of detecting a temperature of the SOA 11 in the second exemplary embodiment. In the second exemplary embodiment, the temperature of the SOA 11 is detected using Amplified Spontaneous Emission (ASE) of the SOA 11.

Figure 9:
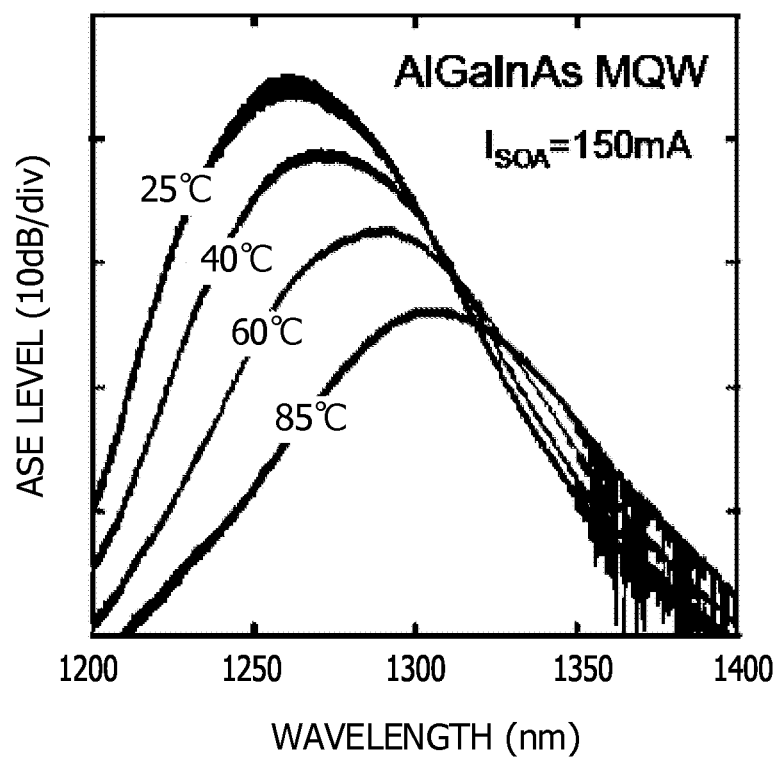
FIG. 9 is a view illustrating an example of a temperature change of an ASE spectrum of an SOA.

FIG. 9 illustrates an example of a temperature change of an ASE spectrum of the SOA 11. In this example, the SOA 11 is made of AlGaInAs. Also, the driving current of the SOA 11 is 150 mA. Then, the ASE spectrum was measured in a state where a light was not input to the SOA 11.

The ASE spectrum of the SOA 11 depends on the temperature as illustrated in FIG. 9. Specifically, when the temperature of the SOA 11 is low, the ASE power is large. As the temperature of the SOA 11 increases, the ASE power gradually decreases. Also, the ASE power corresponds to a value obtained by integrating a characteristic curve illustrated in FIG. 9. Here, when the driving current of the SOA 11 is assumed to be constant, the ASE power uniquely depends on the temperature of the SOA 11. Specifically, according to an increase of an active layer temperature of the SOA 11, the ASE power monotonically decreases. Accordingly, when the ASE power is measured in a state where a predetermined driving current is supplied to the SOA 11, the temperature of the SOA 11 may be detected.

Therefore, the controller 33 supplies a certain driving current to the SOA 11 and detects an ASE power when the optical signal is not input to the SOA 11. Here, the timing controller 33b specifies a period of time the optical signal is not input to the SOA 11 based on, for example, the detected result of the input power detecting unit 14a. Also, the current controller 33c supplies the predetermined certain driving current to the SOA 11 using the driver 17.

Then, an ASE light according to the driving current is output from the SOA 11. The power of the ASE depends on the temperature of the SOA 11 as described above. The photodetector 32 converts the ASE light output from the SOA 11 into an electrical signal. Then, the temperature detecting unit 33a detects the temperature of the SOA 11 based on the output signal of the photodetector 32. That is, the temperature detecting unit 33a detects the temperature of the SOA 11 based on the ASE power of the SOA 11.

Figure 10:
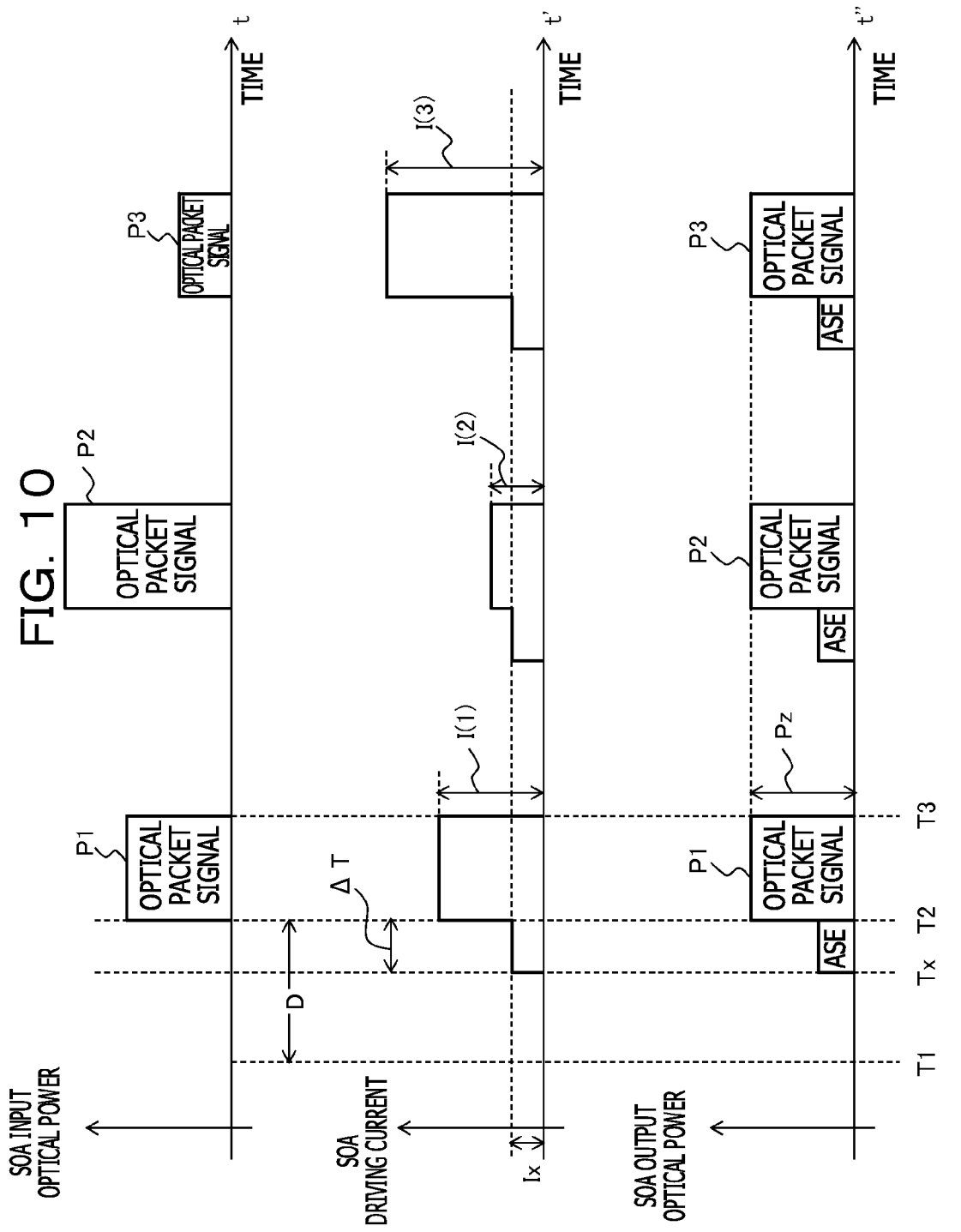
FIG. 10 is a timing chart illustrating an operation of the optical amplification device of the second exemplary embodiment.

FIG. 10 is a timing chart illustrating an operation of the optical amplification device 30 of the second exemplary embodiment. In this example, optical packet signals P1 to P3 are sequentially input to the optical amplification device 30.

At time T1, the optical packet signal P1 is input to the optical amplification device 30. This optical packet P1 is propagated through the optical delay line 13, and input to the SOA 11 at time T2. That is, a time D between T1 and T2 corresponds to a delay time of the optical delay line 13. Also, the optical packet signal P1 is split by the optical coupler 12 to be guided to the detecting unit 14.

The detecting unit 14 generates input power information indicating an input optical power of the optical packet signal P1 and wavelength information indicating a wavelength of the optical packet signal P1. Also, the timing controller 33b of the controller 33 specifies a timing of supplying a driving current to the SOA 11 according to the input power information. Also, in the following description, the delay time of the optical path that leads to the detecting unit 14 from the input port, the detection time of the detecting unit 14, and the processing time of the controller 33 are ignored.

The timing controller 33b detects a rising edge of the input optical power. In this example, at time T1, a rising edge of the input optical power is detected. Then, the timing controller 33b determines time T2. Time T2 is obtained by adding time T1 when the rising edge of the input optical power is detected to a time D. The time D corresponds to the length of the optical delay line 13, and thus is already known. The timing controller 33b determines time Tx. Time Tx is obtained by subtracting time ΔT from the T2. Time ΔT is not particularly limited, but corresponds to, for example, a period of an operation clock of the controller 33.

The current controller 33c generates a current command signal indicating a predetermined current Ix at time Tx to time T2. Also, the driver 17 supplies the driving current Ix to the SOA 11 according to the current command signal. Here, in the SOA 11, an optical signal has not been input. Then, the SOA 11 outputs an ASE light according to the driving current Ix. The ASE light output from the SOA 11 is split by the optical coupler 31 and converted into an electrical signal by the photodetector 32. The temperature detecting unit 33a detects the temperature of the SOA 11 based on the output signal of the photodetector 32. Here, it is assumed that the current controller 33c determines the driving current using, for example, the look-up table illustrated in FIG. 6. In this case, the temperature detecting unit 33a compares the output signal of the photodetector 32 to the threshold value that is prepared in advance to generate 2-bit address data.

In this manner, the controller 33 detects an ASE power in a period the optical signal has not been input to the SOA 11 to detect the temperature of the SOA 11. Specifically, the controller 33 detects an ASE power just before the optical signal is input to the SOA 11 to detect the temperature of the SOA 11.

Subsequently, the current controller 33c determines a driving current based on input power information indicating the input optical power of the optical packet signal P1, wavelength information indicating the wavelength of the optical packet signal P1, and temperature information indicating the temperature of the SOA 11. The input power information and the wavelength information are detected from the optical packet signal P1 guided to the detecting unit 14. Also, the input power information and the wavelength information are generated by, for example, the circuit illustrated in FIG. 4. Also, the temperature information is generated by the temperature detecting unit 33a as described above.

The current controller 33c determines the driving current using, for example, a look-up table illustrated in FIG. 6. In this case, each of the input power information, the wavelength information, and the temperature information is converted into 2-bit address data. Then, the current controller 33c acquires corresponding driving current data from the look-up table to generate a current command signal. The current command signal is output from time T2 to time T3. As a result, from time T2 to time T3, the driving current corresponding to the input power information, the wavelength information, and the temperature information is supplied to the SOA 11, and the power of the optical packet signal P1 output from the SOA 11 is controlled to a target level. Also, time T3 is obtained by adding a time when the falling edge of the input optical power is detected to the time D.

In the example illustrated in FIG. 10, a driving signal I(1) is generated in relation to the optical packet signal P1, and the output power of the optical packet signal P1 is controlled to a target level Pz. The operations of amplifying the optical packet signals P2 and P3 are substantially the same as that of the optical packet signal P1. That is, a driving signal I(2) is generated in relation to the optical packet signal P2, and the output power of the optical packet signal P2 is controlled to a target level Pz. Also, a driving signal I(3) is generated in relation to the optical packet signal P3, and the output power of the optical packet signal P3 is controlled to a target level Pz.

In this manner, the optical amplification device 30 of the second exemplary embodiment detects the temperature of the SOA 11 just before each optical packet signal is input to the SOA 11, and controls the driving current of the SOA 11 according to the detected result. Accordingly, the optical amplification device 30 may control the driving current of the SOA 11 in consideration of the precisely detected temperature of the SOA 11. Accordingly, according to the second exemplary embodiment, the output power of the optical packet signal may be precisely controlled to a target level.

The optical amplification device 30 detects the temperature of the SOA 11 using an ASE power of the SOA 11. Here, when the temperature of the SOA 11 is changed, the ASE power is also changed according to the temperature change without any substantial delay. Accordingly, according to the second exemplary embodiment, the temperature of the SOA 11 may be precisely detected. Meanwhile, in a configuration where a temperature measuring element is provided in the vicinity of the SOA 11, a time of at least 10 msec is required until a heat is transferred from the SOA 11 to the temperature measuring element. However, the length of the optical packet signal ranges from about 10 nsec to 1 msec. Therefore, in this configuration, it is difficult to precisely detect the temperature of the SOA 11 when the optical packet signal passes through the SOA 11.

Another Exemplary Embodiment

In the exemplary embodiment illustrated in FIG. 7, the optical amplification device 30 is not provided with a circuit for controlling the temperature of the SOA 11, but the present disclosure is not limited to this configuration. That is, the optical amplification device 30 may include a circuit (e.g., a Peltier device) for cooling the SOA 11. However, in the configuration where the temperature of the SOA 11 is controlled to be a constant temperature using a Peltier device, a noise of a driving circuit may be added to an optical signal. Accordingly, in an exemplary embodiment, a constant driving current is supplied to a Peltier device without performing a constant temperature control. In this case, since the temperature of the SOA 11 is decreased as compared to that in a configuration in which a Peltier device is not provided, the optical amplification device 30 may efficiently amplify an optical signal in a region with a large optical gain.

Figure 11:
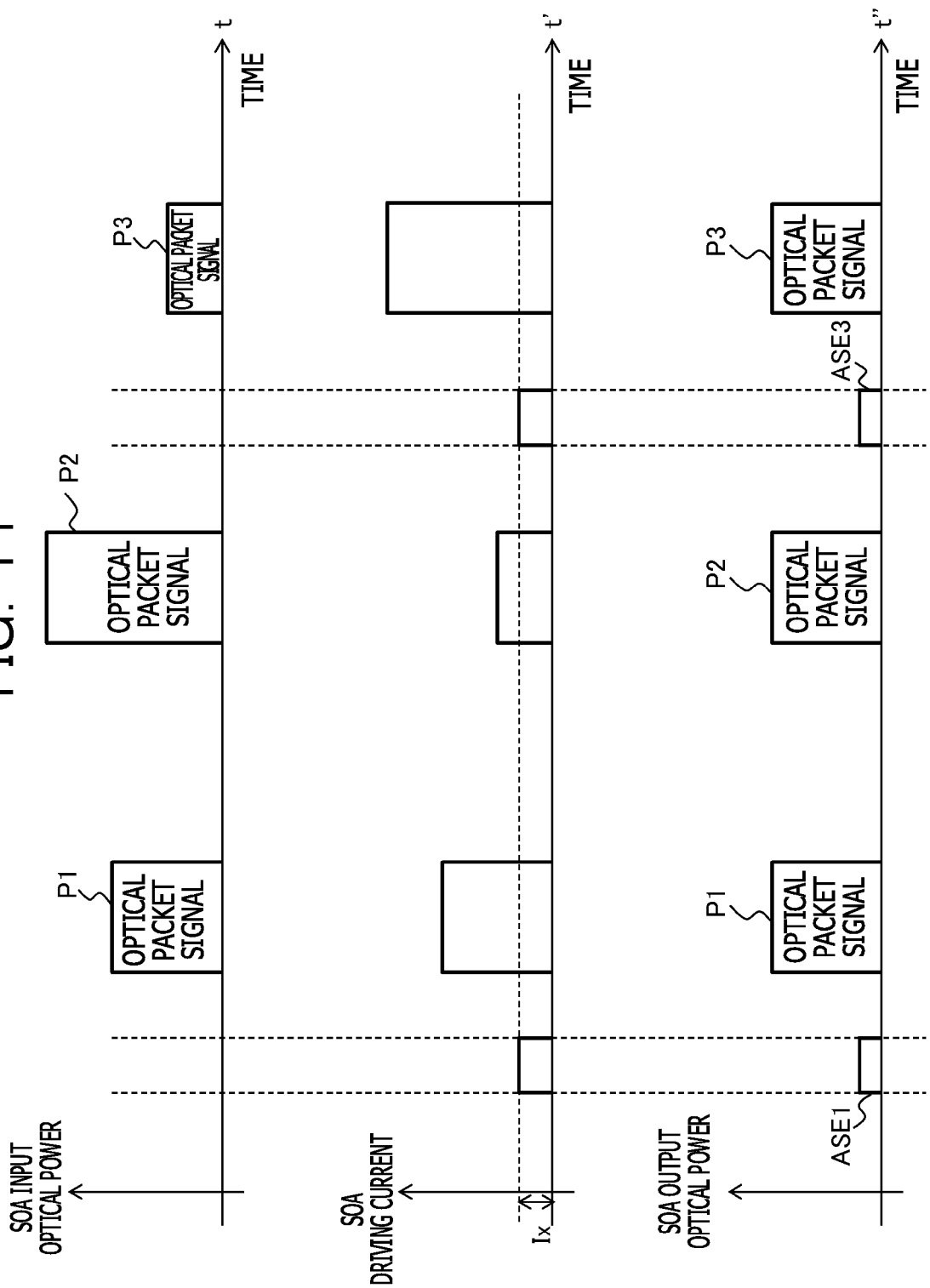
FIG. 11 is a timing chart illustrating another operation example of the optical amplification device of the second exemplary embodiment.

In the exemplary embodiment illustrated in FIG. 10, the temperature of the SOA 11 is detected just before an optical packet signal is input to the SOA 11, but the present disclosure is not limited to this configuration. That is, the temperature detecting unit 33a may detect the temperature of the SOA 11 at any period the optical packet signal does not pass through the SOA 11. In this case, the temperature detecting unit 33a may generate a driving current for measuring an ASE power without detecting a rising edge of the input optical power. Also, the temperature detecting unit 33a does not need to detect the temperature of the SOA 11 individually on all optical packet signals. In the example illustrated in FIG. 11, two temperature detections are performed on the three optical packet signals P1 to P3. In this case, the driving currents of the optical packet signals P1 and P2 are controlled using an optical power of ASE1, and the driving current of the optical packet signal P3 is controlled using an optical power of ASE3.

Otherwise, the optical amplification device 30 may repeatedly detect the temperature of the SOA 11 at predetermined time intervals. However, when an optical packet signal passes through the SOA 11 at a timing of performing a temperature detection, the controller 33 does not perform a temperature detection.

Also, when the period of time an optical packet signal is not received is conventionally known, the optical amplification device 30 may detect the temperature of the SOA 11 at the known period of time. For example, when the optical amplification device 30 is used in the PON system 1 in FIG. 1, the OLT station 2 may manage an incoming signal to be transmitted from each user to the OLT station 2. In this case, the optical amplification device 30 may acquire information indicating a time zone where an incoming signal is not present, from the OLT station 2, and determine a timing of detecting the temperature of the SOA 11 according to the information.

In the exemplary embodiment illustrated in FIG. 7, the optical amplification device 30 detects the temperature of the SOA 11 based on ASE at the output side of the SOA 11, but the present disclosure is not limited to this configuration. For example, the optical amplification device 30 may detect the temperature of the SOA 11 based on ASE at the input side of the SOA 11. When a driving current is supplied to the SOA 11, an ASE light is emitted at the input side of the SOA 11 as well as the output side of the SOA 11. The power of the ASE light emitted at the input side of the SOA 11 also depends on the temperature.

Figure 12:
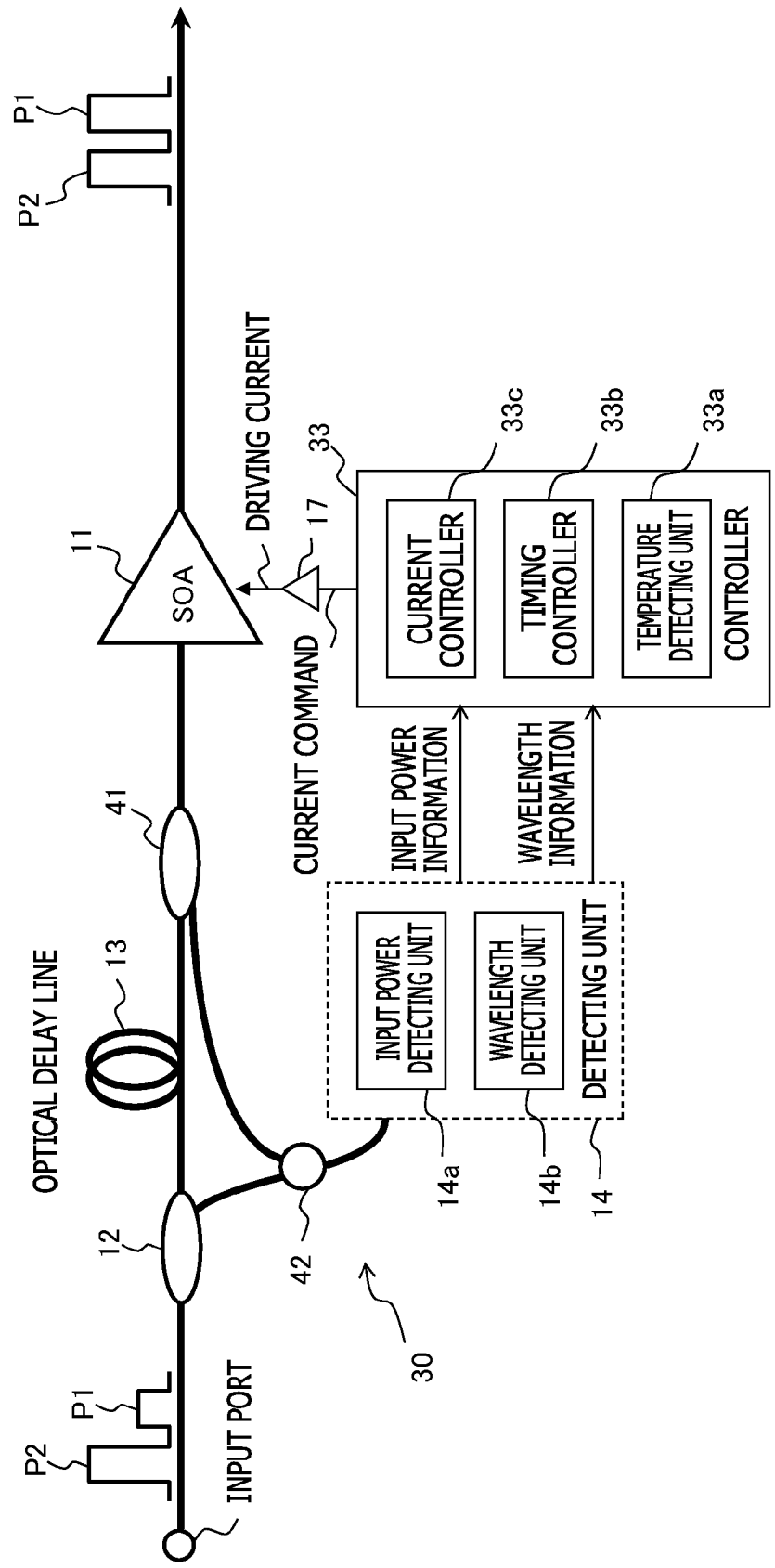
FIG. 12 is a view illustrating an example of an optical amplification device configured to detect a temperature based on ASE at the input side of an SOA.

FIG. 12 illustrates an example of an optical amplification device configured to detect a temperature based on ASE at the input side of the SOA 11. In this case, the optical amplification device 30 has optical couplers 41 and 42. The optical coupler 41 is provided between the optical delay line 13 and the SOA 11. Then, the optical coupler 41 guides an ASE light emitted at the input side of the SOA 11 to the optical coupler 42. The optical coupler 42 is provided between the optical coupler 12 and the detecting unit 14. The optical coupler 42 guides an optical signal received through the input port and the ASE light of the SOA 11 to the detecting unit 14.

The functions of the detecting unit 14 and the controller 33 are substantially the same in FIGS. 7 and 12. Meanwhile, in the configuration illustrated in FIG. 12, the power of the ASE light emitted at the input side of the SOA 11 is detected by the input power detecting unit 14a. Then, the temperature detecting unit 33a detects the temperature of the SOA 11 based on the ASE power detected by the input power detecting unit 14a.

In the exemplary embodiments illustrated in FIGS. 7 and 12, the optical amplification device 30 controls the driving current such that the output optical power reaches a target level based on the input optical power of an optical packet signal, the wavelength of the optical packet signal, and the temperature of the SOA 11, but the present disclosure is not limited to this configuration. That is, the optical amplification device 30 may control the driving current based on the input optical power of the optical packet signal, and the temperature of the SOA 11 without any consideration for the wavelength of the optical packet signal. For example, when the width of the wavelength band where the optical signal is disposed is narrow, the driving current may be determined without any consideration for the wavelength. Also, when the optical gain of the SOA is flat with respect to the wavelength in the wavelength band where the optical signal is disposed, the driving current may be determined without any consideration for the wavelength.

Figure 13A:
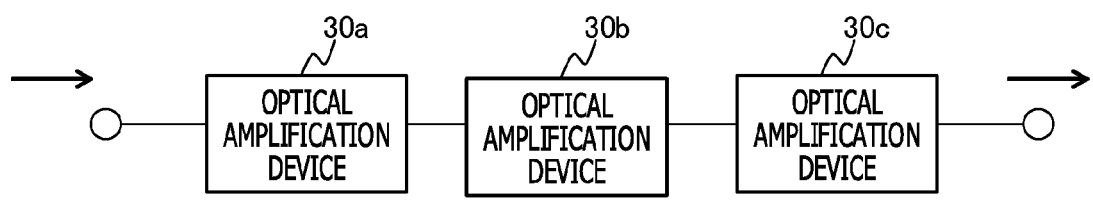
FIGS. 13A and 13B are views illustrating an example of an optical amplification device with suppressed wavelength dependence.
Figure 13B:
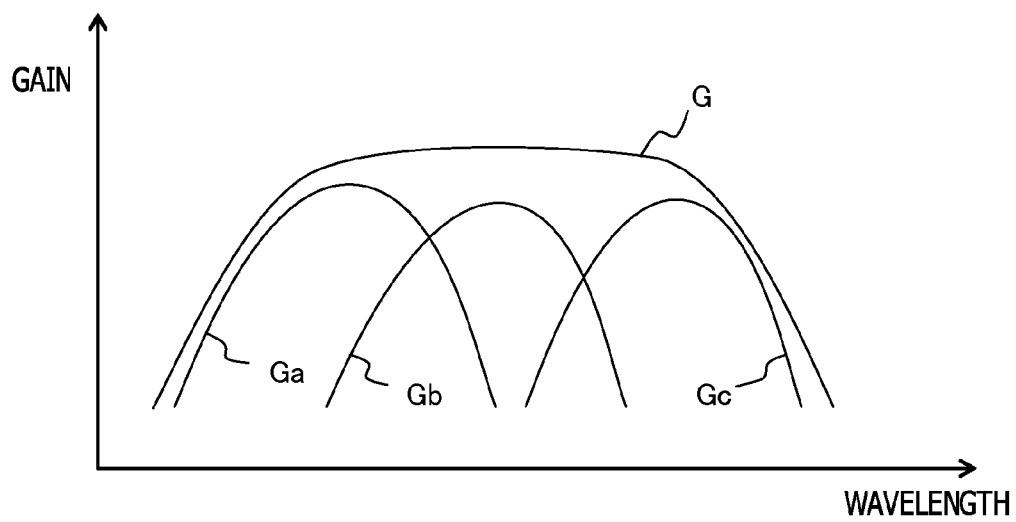

FIGS. 13A and 13B illustrate an example of an optical amplification device with suppressed wavelength dependence. The optical amplification device is, as illustrated in FIG. 13A, configured by connecting a plurality of optical amplification devices 30a to 30c in series. The configuration and function of each of the optical amplification devices 30a to 30c are substantially the same as those in the optical amplification device 30 illustrated in FIG. 7 or FIG. 12. Meanwhile, the optical amplification devices 30a to 30c have different gain characteristics. For example, as illustrated in FIG. 13B, the wavelengths at which peaks of gains Ga to Gc of the optical amplification devices 30a to 30c may be obtained are different from each other. Also, it is assumed that a desired gain characteristic may be obtained by changing the composition and structure of an SOA element. Then, each of the optical amplification devices 30a to 30c controls a driving current such that a total gain G obtained by adding up the gains Ga to Gc is flat with respect to the wavelength. In this manner, when the total gain G is flat with respect to the wavelength, the optical amplification device may control the driving current based on the input optical power of an optical packet signal and the temperature of the SOA without any consideration for the wavelength of the optical packet signal.

In the above described exemplary embodiment, the optical amplification device 30 operates as a level controller configured to control the optical power of each optical packet signal to a target level, but the present disclosure is not limited thereto. For example, the optical amplification device 30 may operate as an optical switch configured to control the optical power of a designated optical packet signal to a target level, and block other optical packet signals. In this case, the optical amplification device 30 may block, for example, signals of a specific user.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical amplification device comprising:
a semiconductor optical amplifier;
a first detector that detects an input optical power of the semiconductor optical amplifier;
a second detector that detects an output optical power of the semiconductor optical amplifier; and
a controller that controls a driving current of the semiconductor optical amplifier,
wherein the controller supplies a predetermined driving current to the semiconductor optical amplifier when an optical signal is not input to the semiconductor optical amplifier based on the input optical power detected by the first detector,
the second detector detects an optical power of Amplified Spontaneous Emission (ASE) output from the semiconductor optical amplifier when the predetermined driving current is supplied to the semiconductor optical amplifier, and
the controller controls the driving current of the semiconductor optical amplifier based on the input optical power of the semiconductor optical amplifier detected by the first detector, and the optical power of the ASE.

2. The optical amplification device according to claim 1, further comprising:
an optical splitter that splits a light input to the semiconductor optical amplifier and guides the light to the first detector; and
an optical delay line provided between the optical splitter and the semiconductor optical amplifier,
wherein the controller supplies the predetermined driving current to the semiconductor optical amplifier before the optical signal is input to the semiconductor optical amplifier based on a time when a rising edge of the input optical power of the semiconductor optical amplifier has been detected by the first detector.

3. The optical amplification device according to claim 1, further comprising:
a wavelength detector that detects a wavelength of a light input to the semiconductor optical amplifier,
wherein the controller controls the driving current of the semiconductor optical amplifier based on the input optical power of the semiconductor optical amplifier, the optical power of the ASE, and the wavelength of the light input to the semiconductor optical amplifier.

4. The optical amplification device according to claim 3, further comprising:
a memory that stores control information indicating a combination of the input optical power of the semiconductor optical amplifier, a temperature of the semiconductor optical amplifier, the wavelength of the light input to the semiconductor optical amplifier, and the driving current of the semiconductor optical amplifier in order to control the output optical power of the semiconductor optical amplifier to a designated target level,
wherein the controller determines the driving current of the semiconductor optical amplifier by referring to the control information stored in the memory based on the input optical power of the semiconductor optical amplifier, the temperature of the semiconductor optical amplifier calculated based on the optical power of the ASE, and the wavelength of the light input to the semiconductor optical amplifier.

5. The optical amplification device according to claim 1, further comprising
a cooling element that cools the semiconductor optical amplifier.

* * * * *